United States Patent
Chu et al.

(10) Patent No.: US 9,630,837 B1
(45) Date of Patent: Apr. 25, 2017

(54) MEMS STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chia-Hua Chu, Hsinchu County (TW); Chun-Wen Cheng, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/996,933

(22) Filed: Jan. 15, 2016

(51) Int. Cl.
　　*B81C 1/00* (2006.01)
　　*B81B 3/00* (2006.01)
　　*H04R 19/00* (2006.01)
　　*H04R 31/00* (2006.01)

(52) U.S. Cl.
　　CPC ........ *B81C 1/00825* (2013.01); *B81B 3/0021* (2013.01); *B81C 1/00158* (2013.01); *B81C 1/00182* (2013.01); *H04R 19/005* (2013.01); *H04R 31/00* (2013.01); *B81B 2203/0127* (2013.01); *B81C 2201/056* (2013.01)

(58) Field of Classification Search
None
See application file for complete search history.

(56) References Cited

U.S. PATENT DOCUMENTS

| | | | | |
|---|---|---|---|---|
| 2001/0041387 A1* | 11/2001 | Tateiwa et al. | ........ | B28D 5/022 438/114 |
| 2001/0055856 A1* | 12/2001 | Tao | .......... | H01L 21/78 438/462 |
| 2012/0148071 A1* | 6/2012 | Dehe | ...... | H04R 1/005 381/116 |
| 2013/0001710 A1* | 1/2013 | Daneman et al. | ...... | H01L 23/10 257/415 |
| 2014/0264662 A1* | 9/2014 | Cheng et al. | ....... | B81C 1/00309 257/419 |
| 2015/0341726 A1* | 11/2015 | Friza | ........ | H04R 7/14 257/416 |

* cited by examiner

*Primary Examiner* — Erik Kielin
(74) *Attorney, Agent, or Firm* — WPAT, P.C., Intellectual Property Attorneys; Anthony King

(57) ABSTRACT

A structure and a fabrication method thereof are provided. The method includes the following operations. A device substrate having a first surface and a second surface opposite to each other is received. A carrier substrate having a third surface and a fourth surface opposite to each other is received. An intermediate layer is formed between the third surface of the carrier substrate and the second surface of the device substrate. The second surface of the device substrate is attached to the third surface of the carrier substrate. The device substrate is thinned from the first surface. A device is formed over the first surface of the device substrate. The carrier substrate and the device substrate are patterned from the fourth surface to form a cavity in the carrier substrate, the intermediate layer and the device substrate.

20 Claims, 16 Drawing Sheets

MEMS STRUCTURE AND MANUFACTURING METHOD THEREOF

BACKGROUND

Microelectromechanical Systems (MEMS) device is micro-sized device, normally in a range from less than 1 micron to several millimeters in size. The MEMS device includes mechanical elements (stationary element and/or movable element) formed over a substrate (e.g., wafer) to sense a physical condition such as force, acceleration, pressure, temperature or vibration, and electronic elements to process electrical signals. The MEMs devices are widely used in applications such as acoustic systems, automotive systems, inertial guidance systems, household appliances, protection systems for a variety of devices, and many other industrial, scientific, and engineering systems.

As technologies evolve, designs for MEMS devices and semiconductor devices become more complicated in view of smaller size and thickness. Numerous manufacturing operations are implemented within such a small and thin device. The manufacturing of the MEMS device and semiconductor device in a miniaturized scale becomes more complicated, and the increase in complexity of manufacturing may cause deficiencies such as high yield loss, wafer crack and other problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
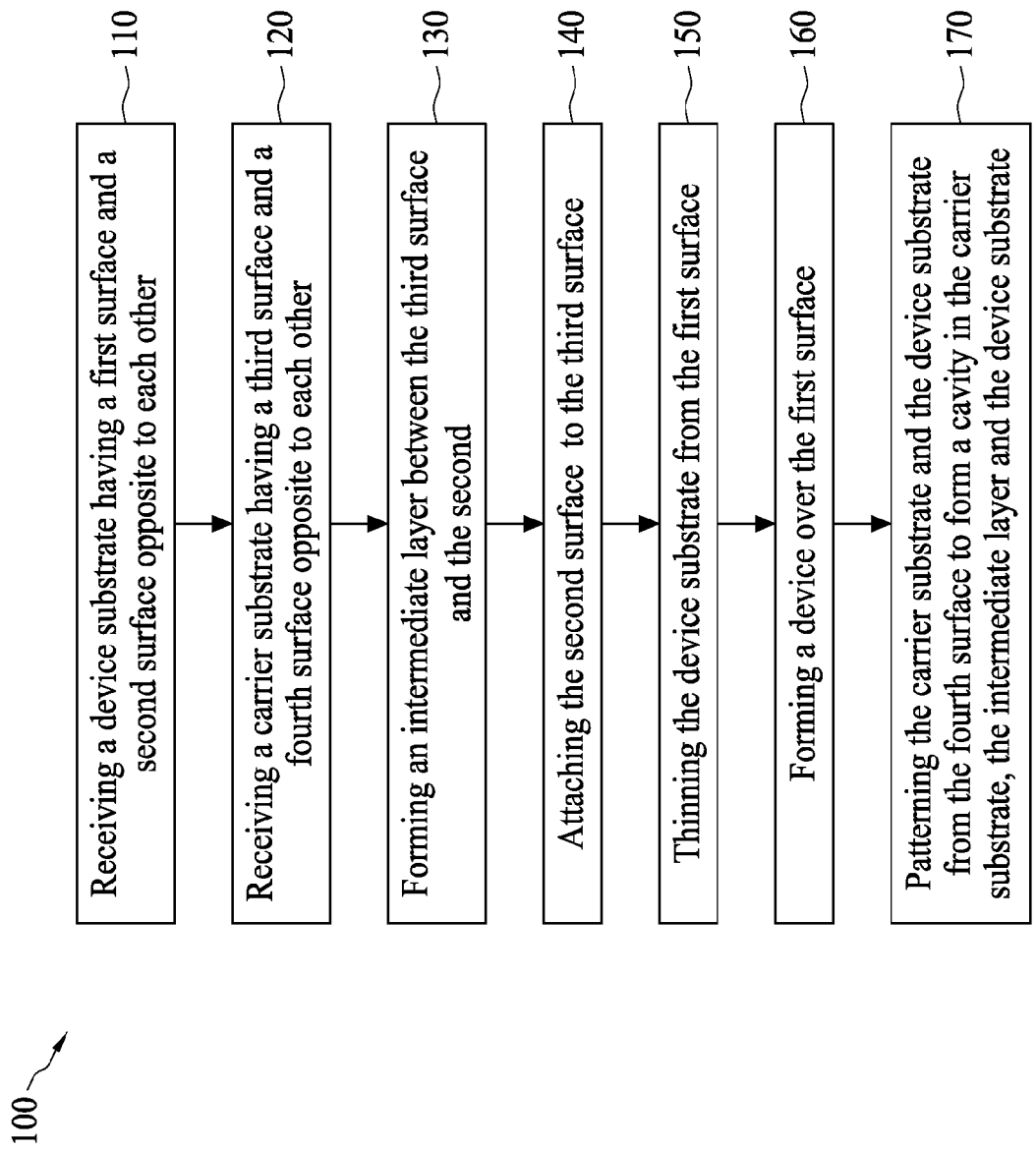
FIG. 1 is a flow chart illustrating a method for manufacturing a structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second", "third" and "fourth" describe various elements, components, regions, layers and/or sections, these elements, components, regions, layers and/or sections should not be limited by these terms. These terms may be only used to distinguish one element, component, region, layer or section from another. The terms such as "first", "second", "third" and "fourth" when used herein do not imply a sequence or order unless clearly indicated by the context.

As used herein, the term "device substrate" is a wafer or a substrate formed of semiconductor material or other materials over which devices such as semiconductor devices, MEMS devices or other devices are formed.

As used herein, the term "carrier substrate" is a wafer or a substrate formed of semiconductor material or other materials used as a carrier or a supporter to carry or support the device substrate during delivery or fabrication. The dimension, material or characteristics of the carrier substrate and those of the device substrate may be the same or different. In some embodiments, the carrier substrate may be reusable.

As used herein, the term "attach" or "attaching" is to combine one object to another object either in a direct contact manner or in an indirect bonding manner. In a direct contact manner, the objects are in physical contact to each other. In an indirect bonding manner, an intervening layer may be used to combine the objects.

In the present disclosure, a method for manufacturing a structure is provided. A device substrate is attached to a carrier substrate, and then the thickness of the device substrate is thinned down to a predetermined thickness. Devices including MEMS device and/or semiconductor devices are then formed on the thinned device substrate. The thinned device substrate is supported by the carrier substrate, and thus is compatible with standard semiconductor process and apparatus.

FIG. 1 is a flow chart illustrating a method for manufacturing a structure according to various aspects of the present disclosure. The method 100 begins with operation 110 in which a device substrate having a first surface and a second surface opposite to each other is received. The method 100 continues with operation 120 in which a carrier substrate having a third surface and a fourth surface opposite to each other is received. The method 100 proceeds with operation 130 in which an intermediate layer is formed between the third surface of the carrier substrate and the second surface of the device substrate. The method 100 continues with operation 140 in which the second surface of the device substrate is attached to the third surface of the carrier substrate. The method 100 continues with operation 150 in which the device substrate is thinned from the first surface. The method 100 proceeds with operation 160 in which a device is formed over the first surface of the device substrate. The method 100 proceeds with operation 170 in which the carrier substrate and the device substrate are patterned from the fourth surface to form a cavity in the carrier substrate, the intermediate layer and the device substrate.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
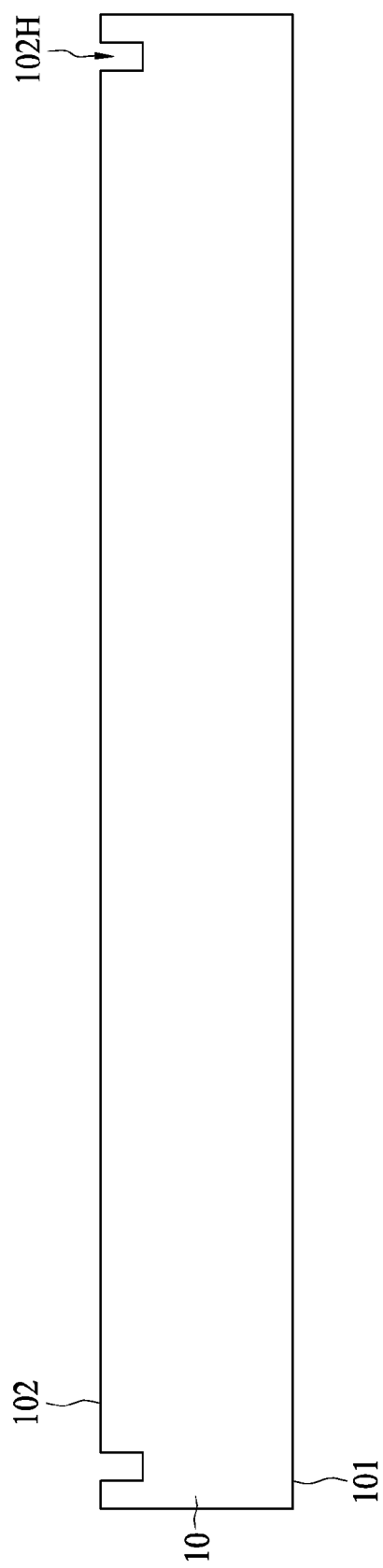
FIGS. 2A, 2B, 2C, 2D, 2E, 2F, 2G, 2H, 2I and 2J are cross-sectional views at one of various operations of manufacturing a structure according to some embodiments of the present disclosure.

FIGS. 2A, 2B, 2C, 2D, 2E, 2F, 2G, 2H, 2I and 2J are cross-sectional views at one of various operations of manufacturing a structure according to some embodiments of the present disclosure. As depicted in FIG. 2A and operation 110 in FIG. 1, the method 100 begins at operation 110 in which a device substrate 10 having a first surface 101 and a second surface 102 opposite to each other is received. The device substrate 10 is a wafer or a substrate over which devices such as semiconductor devices, MEMS devices or other devices are to be formed. In some embodiments, the device substrate 10 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, a conductive substrate, or any other suitable substrates.

In some embodiments, the device substrate 10 is a wafer with a standard diameter and thickness. For example, the device substrate 10 is an eight inch wafer, a twelve inch wafer, or a wafer of another size. The thickness of the device substrate 10 is, for example, about 725 micrometers, but not limited thereto.

In some embodiments, the device substrate 10 may be optionally patterned from the second surface 102 to form a notch 102H. The notch 102H may be formed by etching, laser drilling or any other patterning techniques. The notch 102H is a recess, a trench or an indent in the second surface 102, and is not through the device substrate 10. In some embodiments, the notch 102H resides in a predetermined scribe line, along which the device substrate 10 is to be diced. The notch 102H is configured to ensure the device substrate 10 to be diced substantially along the notch 102H without cracking along another direction during dicing operation (also referred to as a singulation operation).

Figure 2B:
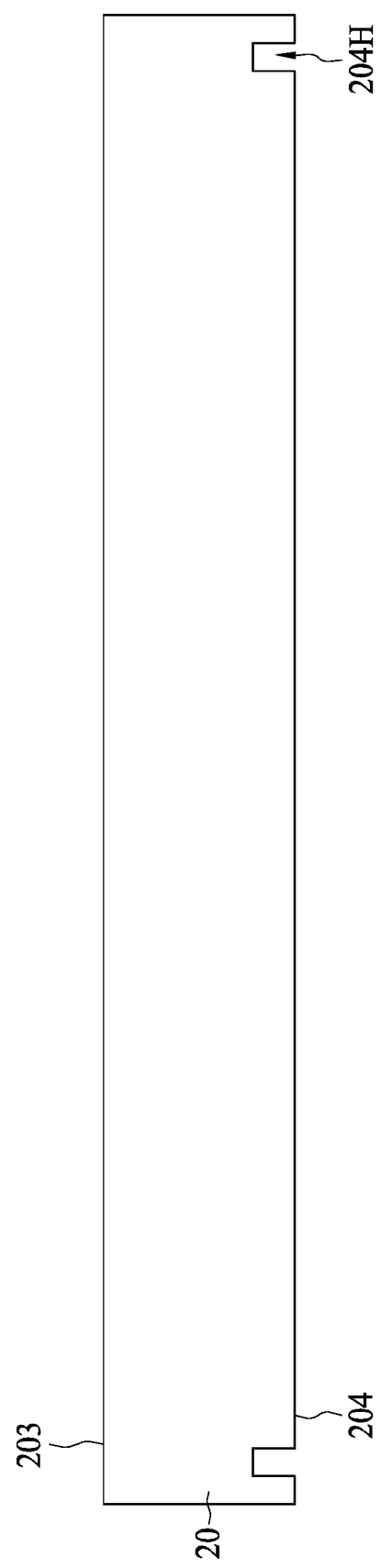

As depicted in FIG. 2B and operation 120 in FIG. 1, the method 100 continues with operation 120 in which a carrier substrate 20 having a third surface 203 and a fourth surface 204 opposite to each other is received. The carrier substrate 20 is a wafer or a substrate used as a carrier or a supporter to carry, support or handle the device substrate 10 during delivery or fabrication. The dimension, material or characteristics of the carrier substrate 20 and those of the device substrate 10 may be the same or different. In some embodiments, the carrier substrate 20 may be reusable.

In some embodiments, the carrier substrate 20 may be optionally patterned from the fourth surface 204 to form a notch 204H. In some embodiments, the notch 204H is formed corresponding to the notch 102H, and has the same functionality as the notch 102H.

Figure 2C:
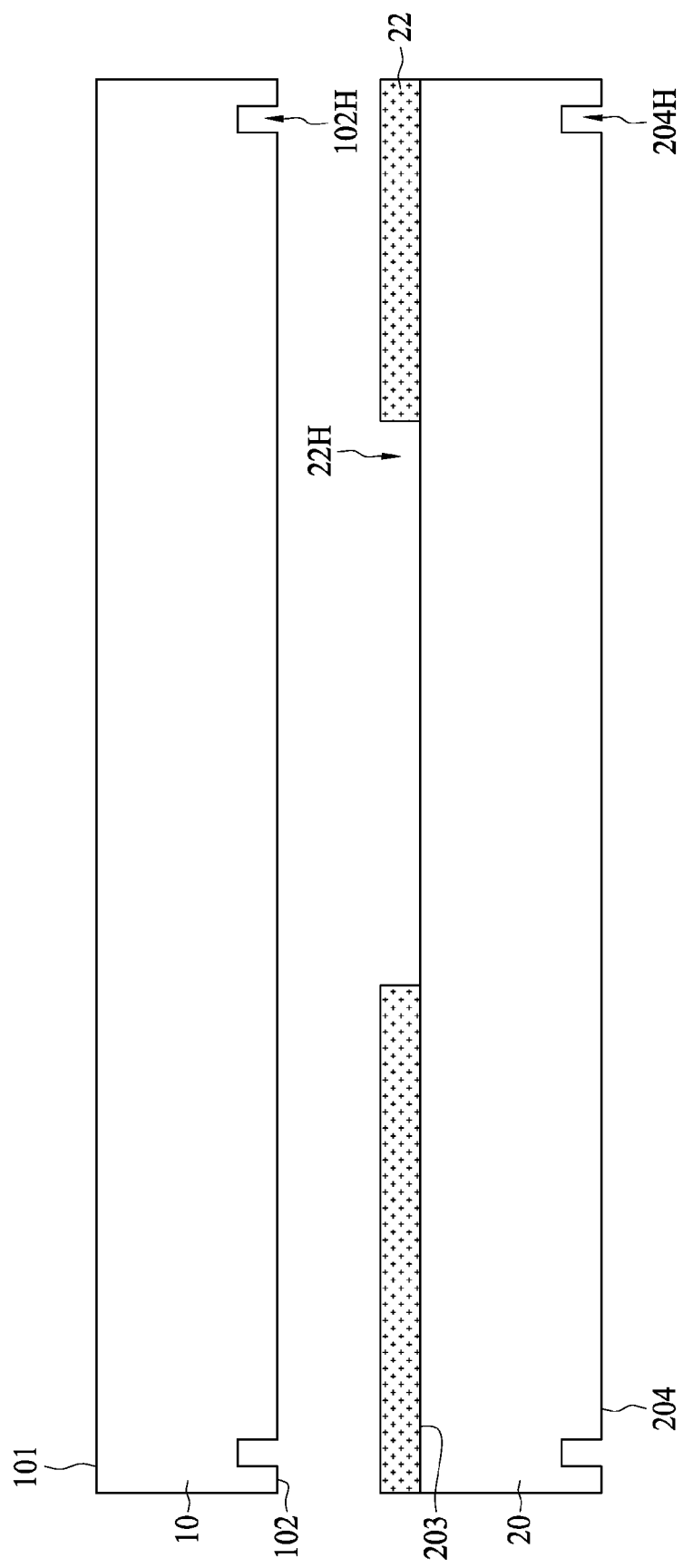

As depicted in FIG. 2C and operation 130 in FIG. 1, the method 100 continues with operation 130 in which an intermediate layer 22 is formed between the third surface 203 of the carrier substrate 20 and the second surface 102 of the device substrate 10. In some embodiments, the intermediate layer 22 is formed over the third surface 203 of the carrier substrate 20 prior to attaching the second surface 102 of the device substrate 10 to the third surface 203 of the carrier substrate 20. In some alternative embodiments, the intermediate layer 22 is formed over the second surface 102 of the device substrate 10 prior to attaching the second surface 102 of the device substrate 10 to the third surface 203 of the carrier substrate 20. In some embodiments, the intermediate layer 22 is a patterned intermediate layer, which has an opening 22H exposing a portion of the third surface 203 of the carrier substrate 20. In some alternative embodiments, the intermediate layer 22 is not patterned and substantially covers the entire third surface 203 of the carrier substrate 20 and the second surface 102 of the device substrate 10.

Figure 2D:
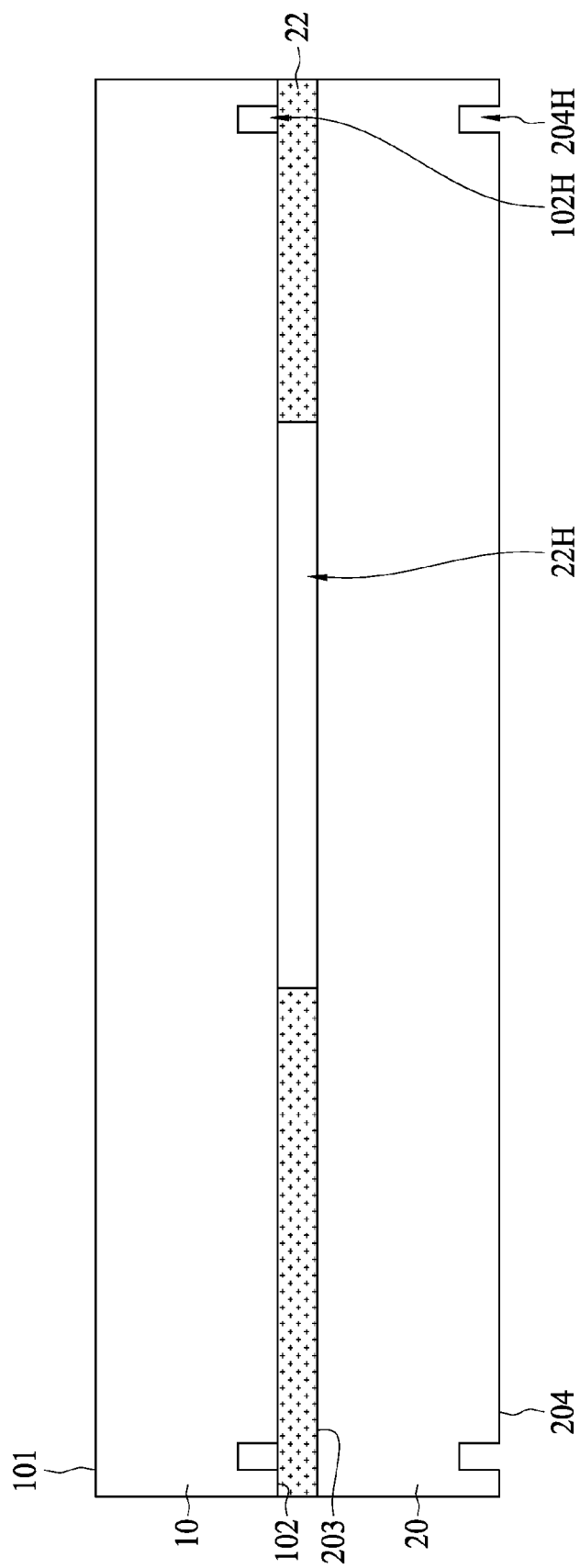

As depicted in FIG. 2D and operation 140 in FIG. 1, the method 100 continues with operation 140 in which the second surface 102 of the device substrate 10 is attached to the third surface 203 of the carrier substrate 20. The device substrate 10 and the carrier substrate 20 may be bonded, e.g., by fusion bonding or any other suitable direct or indirect bonding techniques. In some embodiments, the intermediate layer 22 is adhesive, and the device substrate 10 and the carrier substrate 20 are bonded by the intermediate layer 22. The intermediate layer 22 is disposed between the device substrate 10 and the carrier substrate 20, and configured as a sacrificial releasing layer between the carrier substrate 20 and the device substrate 10. The sacrificial releasing layer is provisionally adhered between the carrier substrate 20 and the device substrate 10, such that the device substrate 10 is able to be supported by the carrier substrate 20 and be thinned to a predetermined thickness to satisfy the requirement for device to be formed. The sacrificial releasing layer will be detached from the carrier substrate 20 and/or the device substrate 10 subsequently after the device substrate 10 is thinned and the device is formed over the device substrate 10. In some embodiments, the intermediate layer 22 is a dielectric material such as silicon oxide, silicon nitride, silicon oxynitride, or any other suitable materials. In some embodiments, the material of the intermediate layer 22 and those of the carrier substrate 20 and the device substrate 10 have distinct etching selectivity.

Figure 2E:
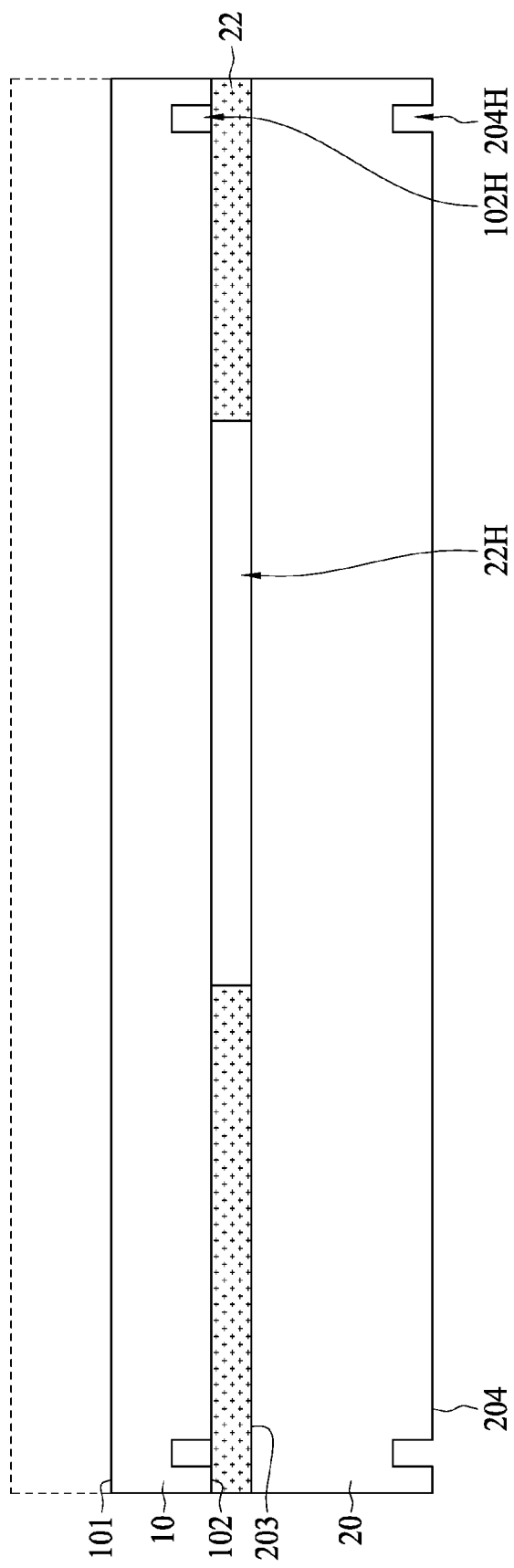

As depicted in FIG. 2E and operation 150 in FIG. 1, the method 100 continues with operation 150 in which the device substrate 10 is thinned from the first surface 101. In some embodiments, the device substrate 10 is thinned to a predetermined thickness to meet the requirement for the device such as MEMS device to be formed. In some embodiments, the predetermined thickness of the thinned device substrate 10 is ranged substantially from about 50 micrometers to about 400 micrometers. Without carrier substrate 20, it is difficult to handle the device substrate 10 with such a thin thickness in standard semiconductor apparatus for the risk of wafer crack is increased. However, as supported by the carrier substrate 20, the device substrate 10 is compatible with standard semiconductor apparatus and manufacturing. The device substrate 10 may be thinned by any mechanical and/or chemical thinning techniques such as grinding, polishing, or etching.

Figure 2F:
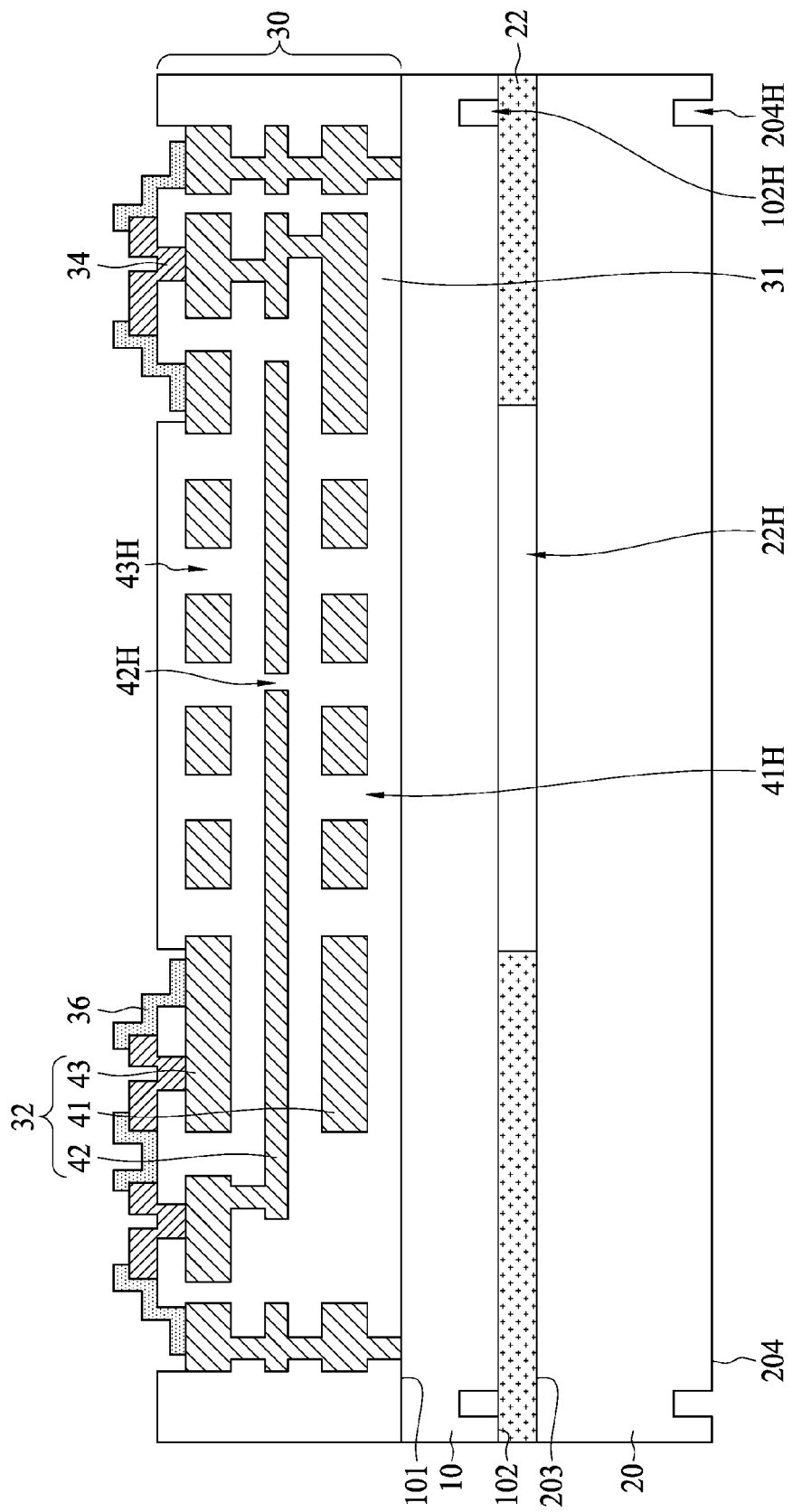

As depicted in FIG. 2F and operation 160 in FIG. 1, the method 100 proceeds with operation 160 in which device(s) 30 is formed over the first surface 101 of the device substrate 10. The device 30 may be a MEMS device, a semiconductor device, an electronic device, a mechanical device, an active device, a passive device, a combination thereof, or any other devices. In some embodiments, the device 30 includes a MEMS device such as an acoustic device. In some embodiments, the device 30 includes a MEMS device such as an acoustic device and an active device such as a CMOS device configured to process signal generated by the MEMS device. By way of example, the acoustic device is a microphone device or ultrasound device, which is configured to sense acoustic wave and convert the acoustic wave into electronic signal.

In some embodiments, forming the device 30 over the first surface 101 of the device substrate 10 includes forming a film stack of a plurality of dielectric layers 31 and conductive layers 32. The dielectric layers 31 and the conductive layers 32 may be formed alternately. In some embodiments, the conductive layers 32 include at least one plate and a diaphragm spaced away from each other by at least one of the dielectric layers 31. In the present embodiment, the conductive layers 32 includes a first plate 41, a diaphragm 42 and a second plate 43, where the diaphragm 42 is interposed between the first plate 41 and the second plate 43. The first plate 41 and the second plate 43 are configured as electrodes. In some embodiments, one of the first plate 41 or the second plate 43 may be omitted. The diaphragm 42 is also referred to as a membrane.

In some embodiments, the diaphragm 42 is conductive or semiconductive. For example, the diaphragm 42 is formed of semiconductor material such as polycrystalline silicon or any other suitable semiconductor materials and doped with p type, n type dopants or the like to be conductive. In some embodiments, the diaphragm 42 is formed of dielectric material or semiconductor material covered with conductive material. In some embodiments, the diaphragm 42 includes a hole 42H to adjust resonance form of the diaphragm 42 and/or to prevent the diaphragm 42 from being broken due to excessive pressure.

The first plate 41 and the second plate 43 are conductive or semiconductive. In some embodiments, the first plate 41 or the second plate 43 is formed of semiconductor material such as polycrystalline silicon and doped with p type, n type dopants or the like to be conductive. In some embodiments, the first plate 41 or the second plate 43 is formed of dielectric material or semiconductor material covered with conductive material. In some embodiments, the first plate 41 or the second plate 43 may be a single-layered structure. In some embodiments, the first plate 41 or the second plate 43 may be a multi-layered structure including a conductive material layer and at least one insulating layer. For example, the multi-layered structure includes a film stack of a silicon nitride layer and a silicon layer (SiN/Si), or a film stack of a silicon nitride layer, a silicon layer and another silicon nitride layer (SiN/Si/SiN).

In some embodiments, the first plate 41 includes ventilation holes 41H, and/or the second plate 43 includes ventilation holes 43H. The ventilation holes 41H and 43H are configured to adjust resonance form of the diaphragm 42 and/or to prevent the diaphragm 42 from being broken due to excessive pressure.

The dielectric layers 31 are configured as sacrificial structural layers. The sacrificial structural layers are formed to support or enclose the conductive layers 32 including the diaphragm 42 and the plate(s) such as the first and second plates 41 and 43. The sacrificial structural layer is provisionally formed between the conductive layers 32, such that the conductive layers 32 are able to be supported during fabrication. A portion of each of the sacrificial structural layers will then be removed, such that an air gap will exist between the diaphragm 42 and each of the first and second plates 41 and 43. The material of the dielectric layer 31 includes semiconductor oxide (e.g., silicon oxide), semiconductor nitride (e.g., silicon nitride), semiconductor oxynitride (silicon oxynitride), or any other suitable dielectric materials. In some embodiments, the material of the dielectric layer 31 and those of the carrier substrate 20 and the device substrate 10 have distinct etching selectivity. In some embodiments, the dielectric layer 31 and the intermediate layer 22 may include the same dielectric material.

In some embodiments, a plurality of connection pads 34 and etching stop layers 36 are formed over the film stack. The connection pad 34 is configured as a connection feature external or internal to the device 30. In some embodiments, the connection pads 34 are electrically connected to the first plate 41 and the second plate 43 respectively. The connection pad 34 may be also electrically connected to another structure such as guard ring. The material of the connection pad 34 may include metal such as gold (Au), alloy such as aluminum copper (AlCu), or any other conductive materials. The etching stop layer 36 is configured to protect the connection pad 34 from being etched or damaged when etching the dielectric layer 31. In some embodiments, the etching stop layers 36 cover lateral sides of the connection pads 34, respectively.

Figure 2G:
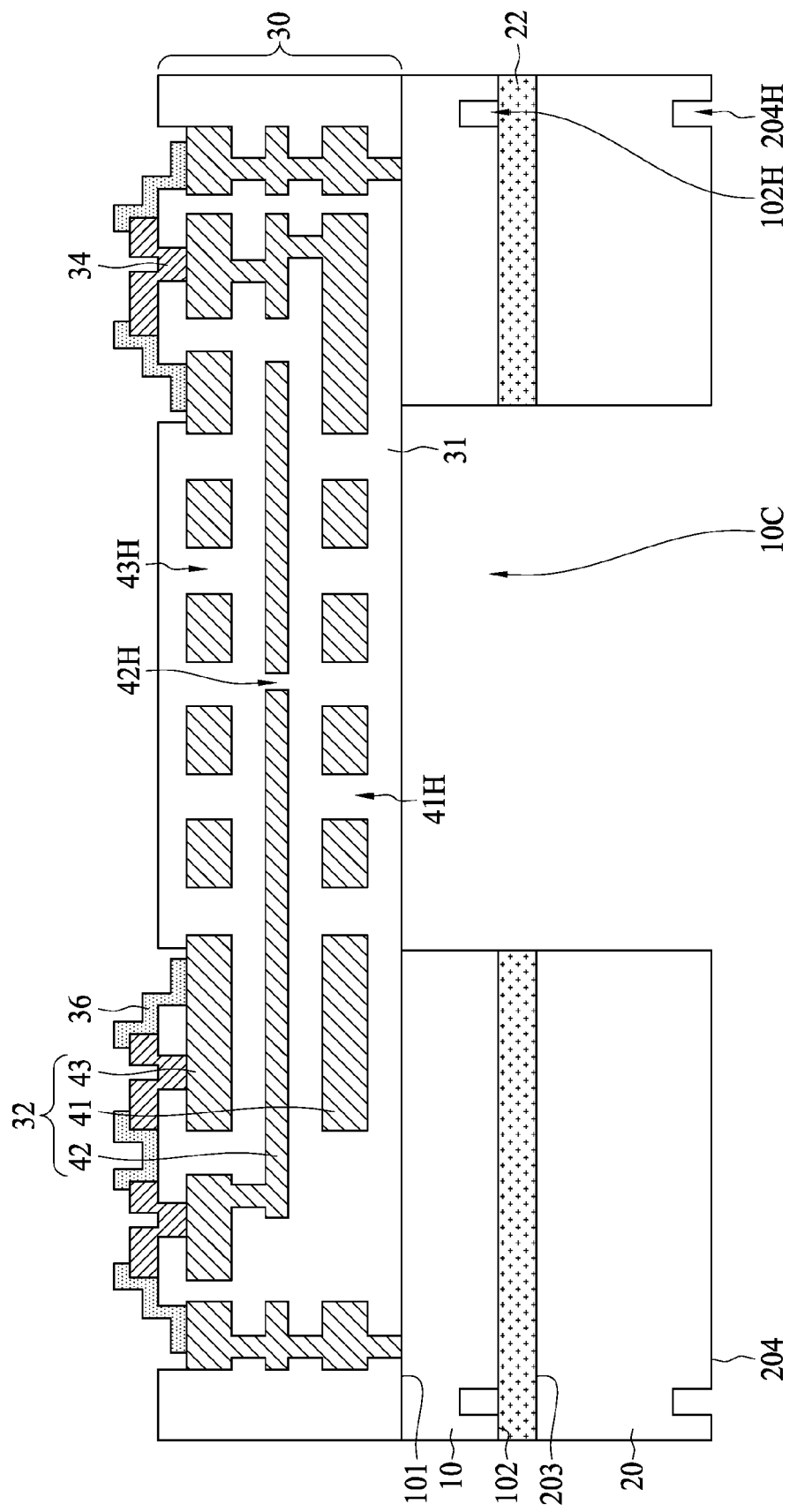

As depicted in FIG. 2G and operation 170 in FIG. 1, the method 100 proceeds with operation 170 in which the carrier substrate 20 and the device substrate 10 are patterned from the fourth surface 204 to form a cavity 10C (also referred to as a back chamber) in the carrier substrate 20, the intermediate layer 22 and the device substrate 10. In some embodiments, the device 30 includes a capacitive microphone device or a capacitive ultrasound device, and the cavity 10C is configured as a resonance chamber. The shape, dimension and depth can be modified based on different considerations such as sensitivity, signal-to-noise ratio, frequency response and other factors. In some embodiments, the sidewall of the cavity 10C is substantially perpendicular to the second surface 102 of the device substrate 10, i.e., the cavity 10C in the carrier substrate 20 and the cavity 10C in the device substrate 10 are equal in size. In some alternative embodiments, the sidewall of the cavity 10C is slanted with respect to the second surface 102 of the device substrate 10. For example, the dimension of the cavity 10C in the device substrate 10 is smaller than the dimension of the cavity 10C in the carrier substrate 20. The cavity 10C may be formed by etching e.g., dry etching and/or wet etching. In some embodiments, the intermedium layer 22 exposed by the cavity 10C is etched off in the same etching operation.

Figure 2H:
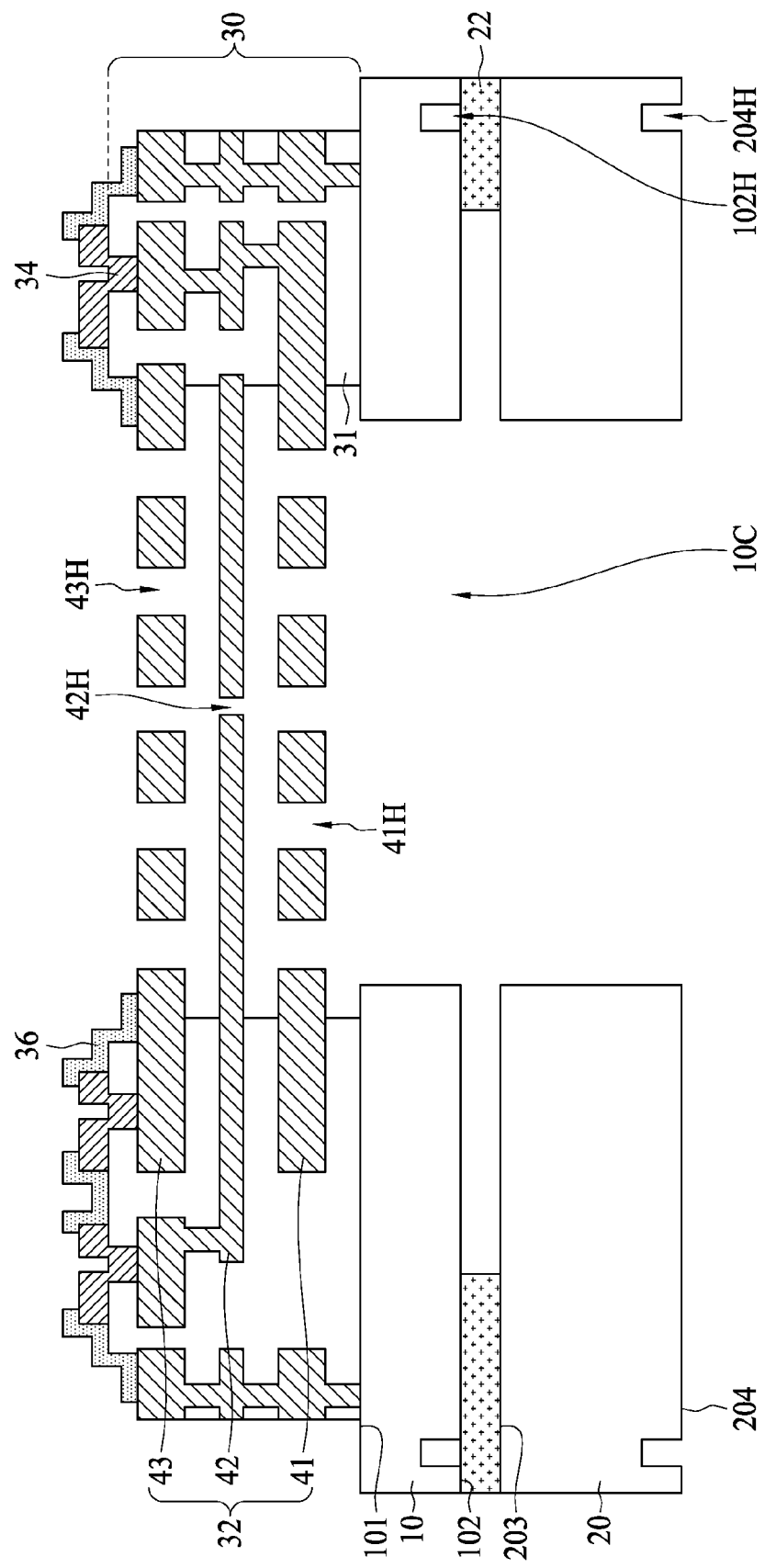

The method 100 may be continued with the following operations. As depicted in FIG. 2H, a portion of each of the dielectric layers 31 is etched through the cavity 10C and through the top surface (the surface opposite to the cavity 10C) of the device 30 to suspend the diaphragm 42. After the portion of the dielectric layers 31 is removed, air gap is formed between the diaphragm 42 and the plate 41 and between the diaphragm 42 and the second plate 43. Accordingly, the diaphragm 42 is spaced away from the first plate 41 and the second plate 43, and thus movable with respect to the first plate 41 and/or the second plate 43. Therefore, the diaphragm 42 is capable of being resonated by acoustic pressure. In some embodiments, a portion of the intermediate layer 22 is etched off simultaneously along with the portion of each of the dielectric layers 31. In such a case, the contact area between the intermediate layer 22 and the carrier substrate 20 is reduced, and thus the device substrate 10 can be easily picked up from the carrier substrate 20.

Figure 2I:
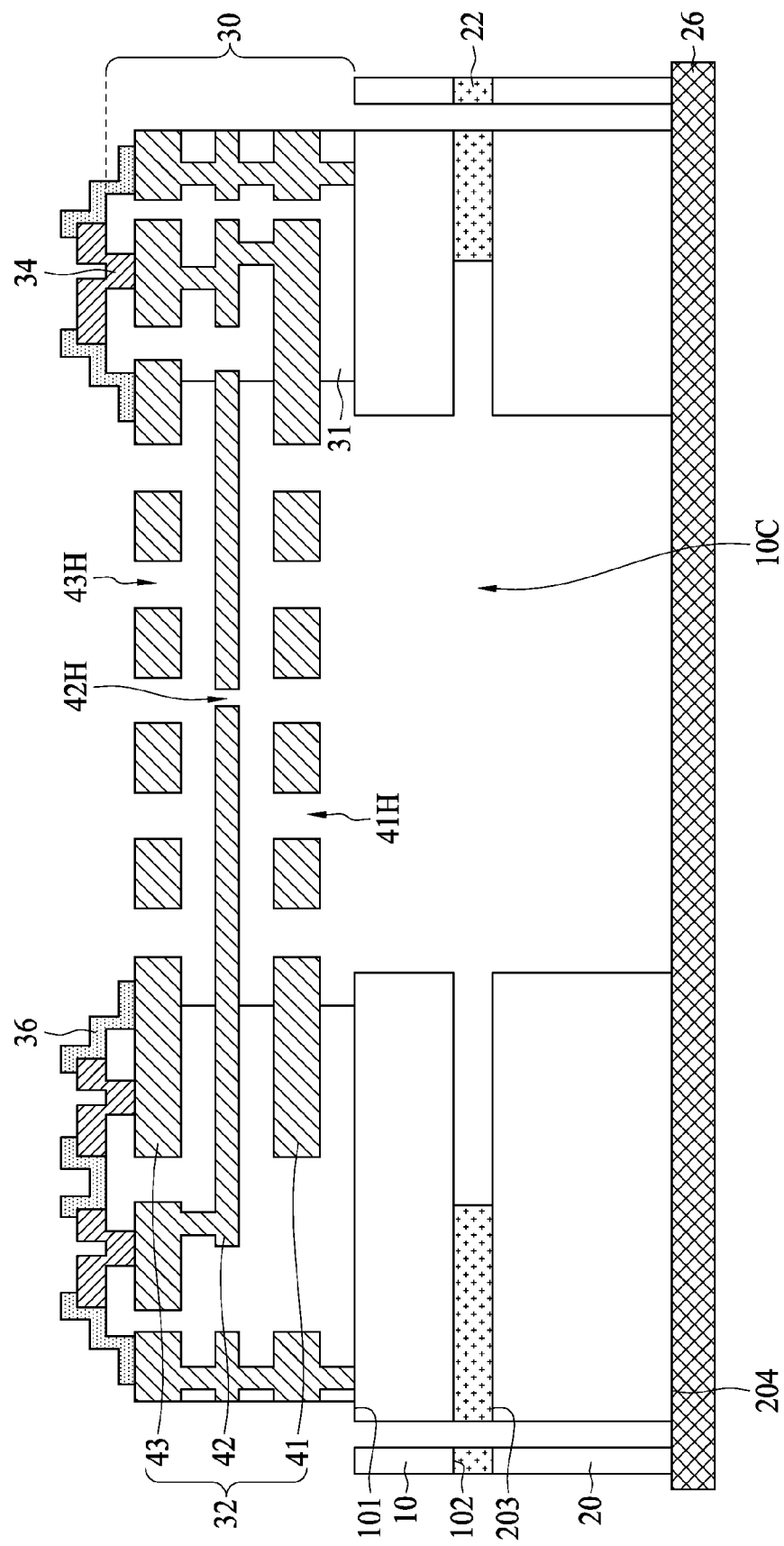

As depicted in FIG. 2I, the fourth surface 204 of the carrier substrate 20 is attached to a film 26. In some embodiments, the film 26 is an adhesive film such as a tape, which can be adhered to the carrier substrate 20. In some embodiments, the film 26 is substantially leveled with the fourth surface 204 of the carrier substrate 20. Then, a dicing operation is performed to cut the device substrate 10 along scribe lines so that the device substrate 10 is divided into pieces, while each piece of the device substrate 10 is still attached to the carrier substrate 20 without falling apart.

In some embodiments, the carrier substrate 20 is not cut along with the device substrate 10. In some alternative embodiments, the carrier substrate 20 is also cut along with the device substrate 10, so that the carrier substrate 20 is divided into pieces. Each piece of the carrier substrate 20 is adhered to the film 26 without falling apart. In some embodiments, the cutting of the device substrate 10 and the carrier substrate 20 is achieved by laser cutting or any suitable cutting techniques. The notch 102H of the device substrate 10 and the notch 204H of the carrier substrate 20 are configured to prevent the device substrate 10 and the carrier substrate 20 from being cracked along other lateral directions during the dicing operation.

Figure 2J:
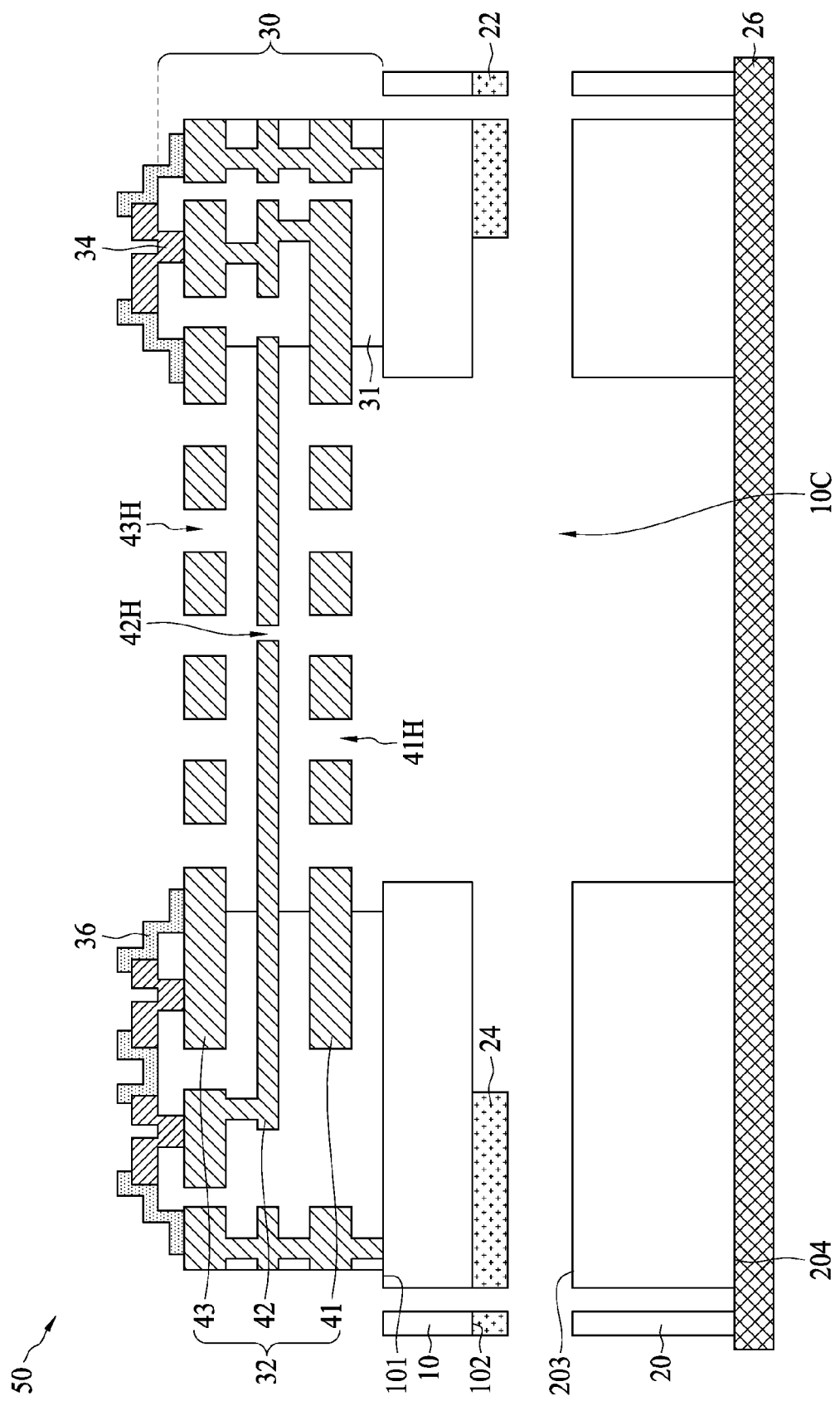

As depicted in FIG. 2J, the device 30 and the respective piece of the device substrate 10 are picked up and separated from the carrier substrate 20. Accordingly, a device structure 50 such as a MEMS structure is fabricated. In some embodiments, the intermediate layer 22 or a portion of the intermediate layer 22 remains on the second surface 102 of the device substrate 10, and therefore forms a bump 24 on the second surface 102 of the device substrate 10. The pattern of the bump 24 may be regularly or irregularly distributed.

The method for manufacturing a structure of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
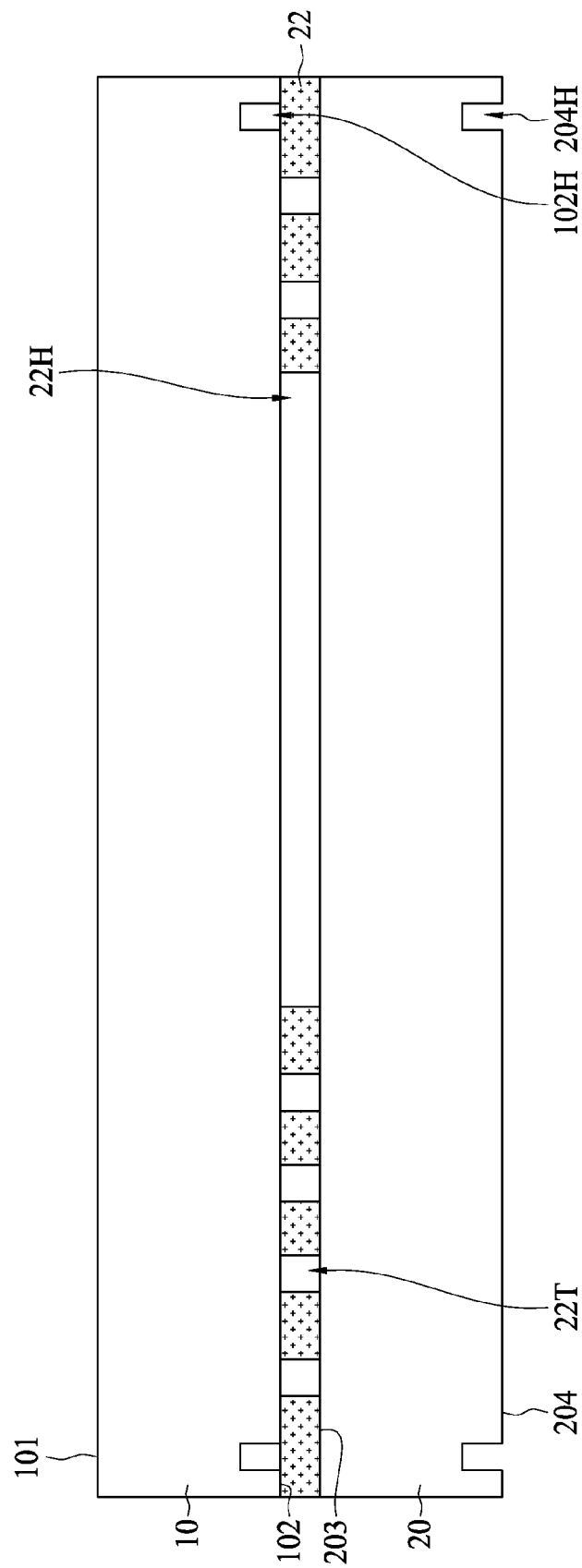
FIGS. 3A, 3B and 3C are cross-sectional views at one of various operations of manufacturing a structure according to some embodiments of the present disclosure.
Figure 3B:
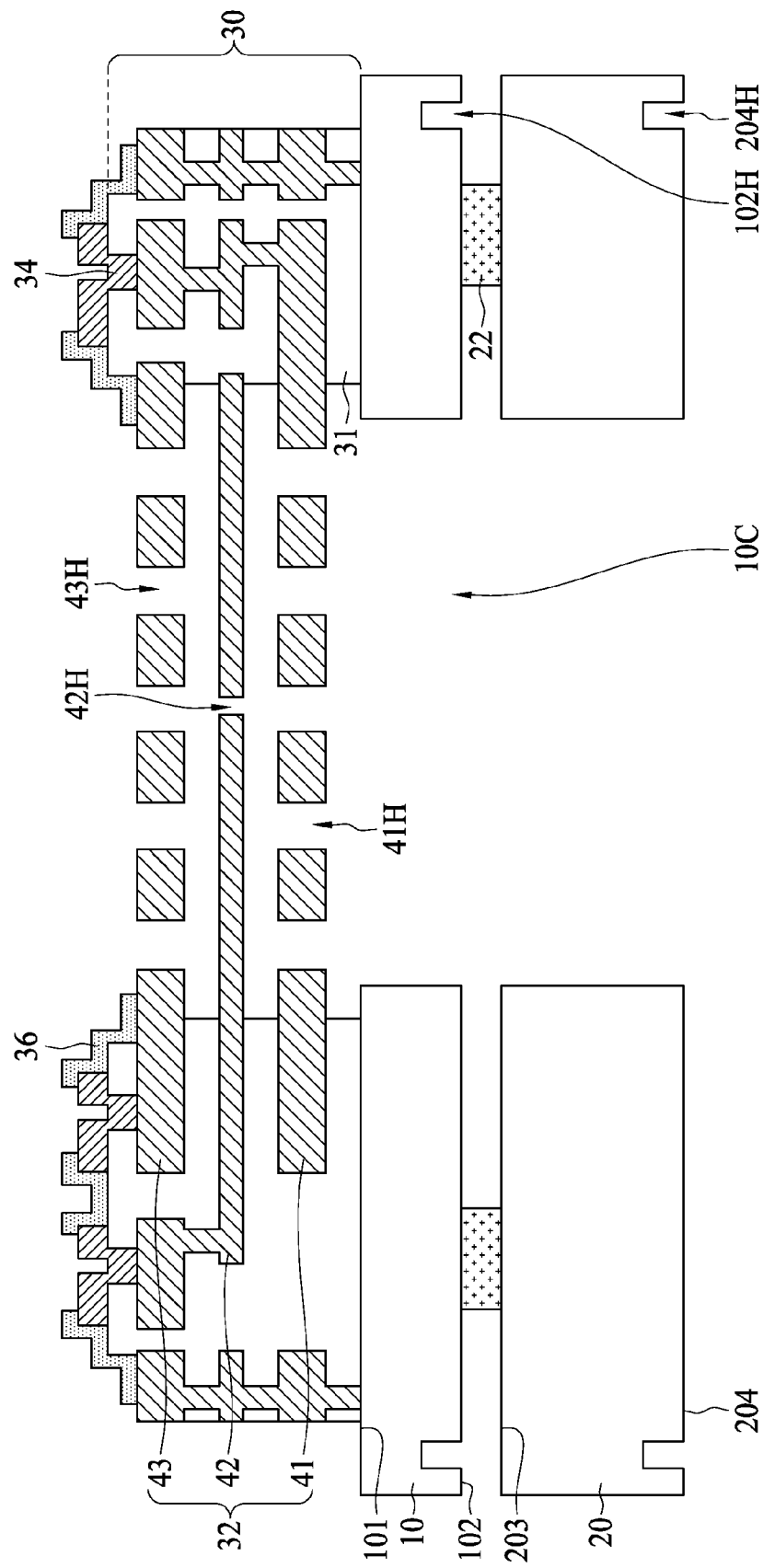
Figure 3C:
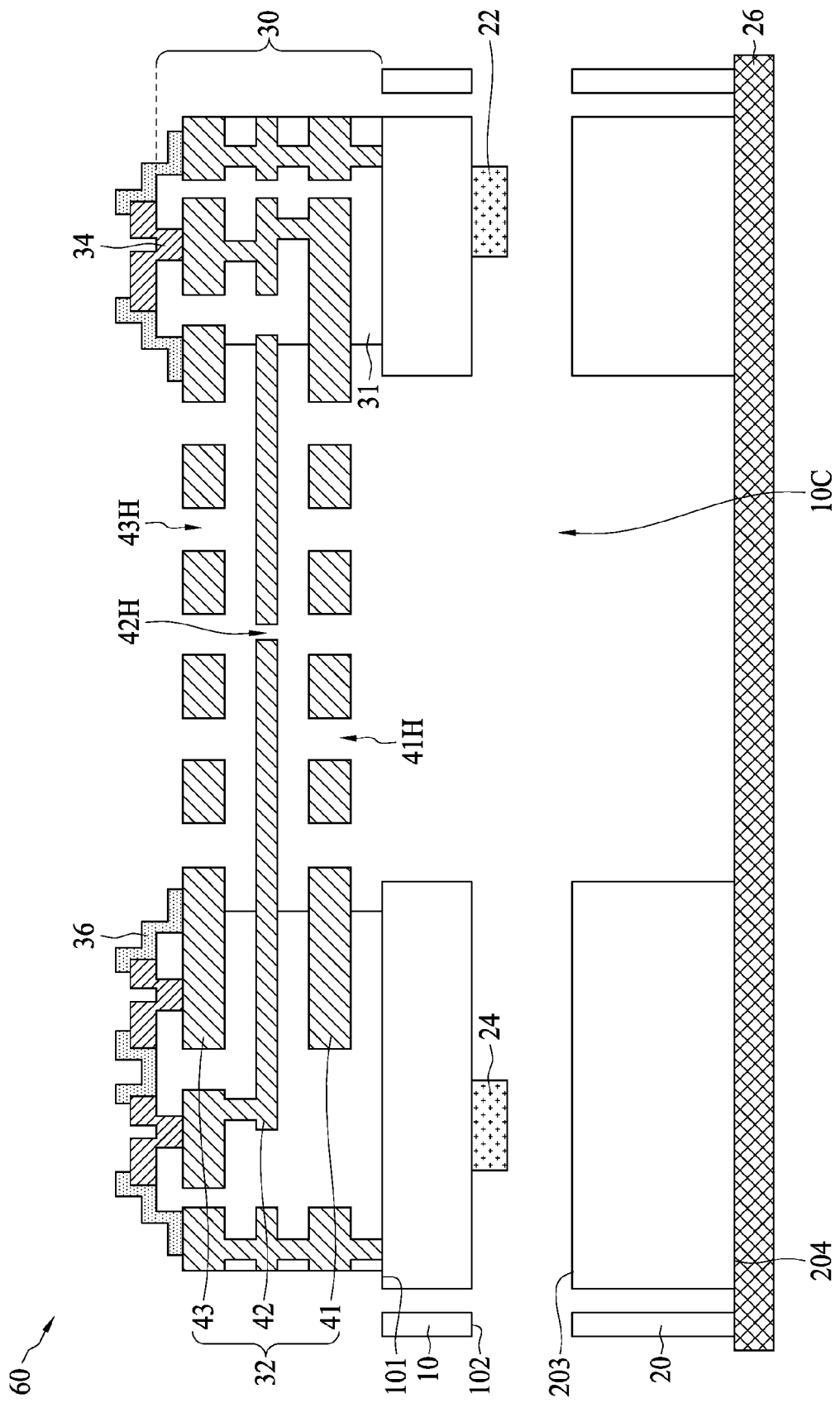

FIGS. 3A, 3B and 3C are cross-sectional views at one of various operations of manufacturing a structure according to some embodiments of the present disclosure. As depicted in FIG. 3A, different from the embodiments of FIGS. 2A-2J, the intermediate layer 22 is patterned to form recesses 22T prior to attaching the second surface 102 of the device substrate 10 to the third surface 203 of the carrier substrate 20. The recess 22T is configured to adjust the contact area between the intermediate layer 22 and the carrier substrate 20 in advance.

As depicted in FIG. 3B, by virtue of the recess 22T (not shown), the contact area between the intermediate layer 22 and the carrier substrate 20 will be reduced to a desired value along with etching the dielectric layers 31. Accordingly, the adhesion between the intermediate layer 22 and the carrier substrate 20 is reduced to a desired value for the sake of following releasing operations. The device 30 is then formed on the device substrate 10.

As depicted in FIG. 3C, the fourth surface 204 of the carrier substrate 20 is attached to a film 26. Subsequently, a dicing operation is performed to cut the device substrate 10 so that the device substrate 10 is divided into pieces, while each piece of the device substrate 10 is still attached to the carrier substrate 20 without falling apart. The device 30 and the respective piece of the device substrate 10 are picked up and separated from the carrier substrate 20. Accordingly, a device structure 60 is fabricated. In some embodiments, the intermediate layer 22 or a portion of the intermediate layer 22 remains on the second surface 102 of the device substrate 10, and therefore forms a bump 24 on the second surface 102 of the device substrate 10. The pattern of the bump 24 may be regularly or irregularly distributed.

Figure 4A:
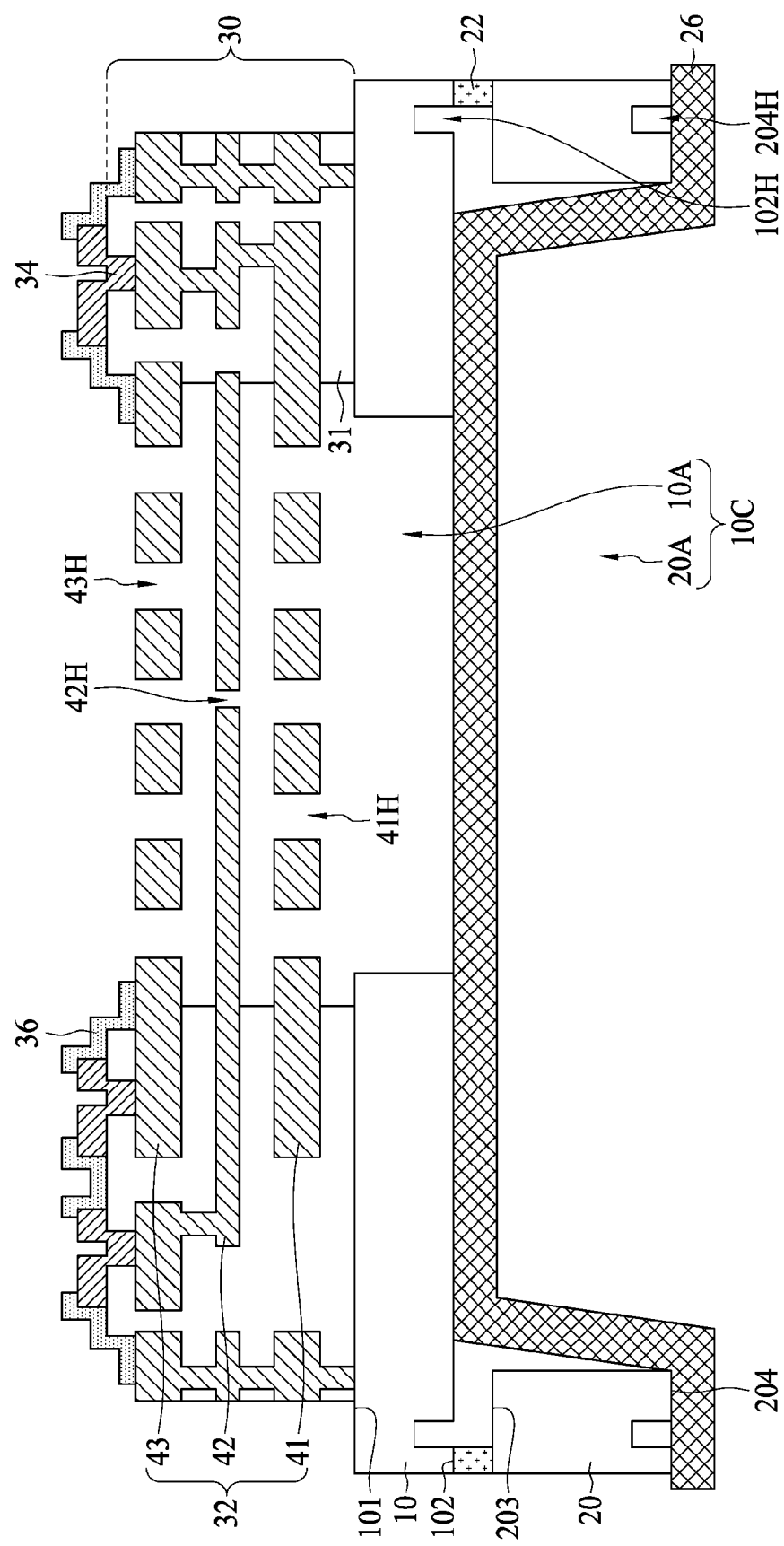
FIGS. 4A and 4B are cross-sectional views at one of various operations of manufacturing a structure according to some embodiments of the present disclosure.
Figure 4B:
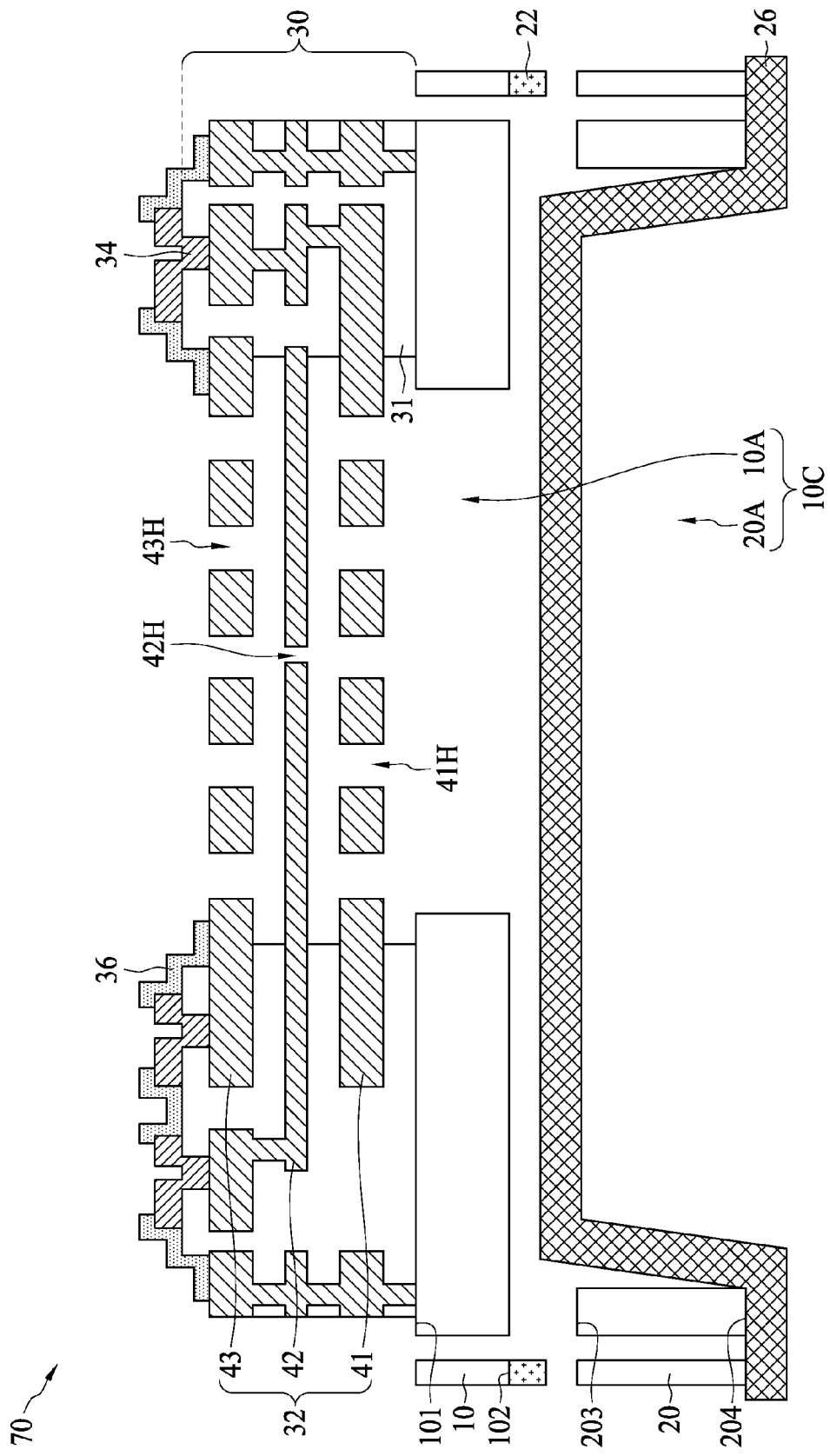

FIGS. 4A and 4B are cross-sectional views at one of various operations of manufacturing a structure according to some embodiments of the present disclosure. As depicted in FIG. 4A, different from the embodiments of FIGS. 2A-2J, the carrier substrate 20 is patterned to form a trench 20A, and the device substrate 10 is patterned to form a via hole 10A. The trench 20A and the via hole 10A together form the cavity 10C, and the dimension of the trench 20A is greater than the dimension of the via hole 10A. In some embodiments, the trench 20A and the via hole 10A are formed by a multi-stage etching, and each of the etching stages may be wet etching or dry etching. The sidewall of the trench 20A may be substantially perpendicular to the fourth surface 204 of the carrier substrate 20 or slanted with respect to the fourth surface 204 of the carrier substrate 20. The sidewall of the via hole 10A may be substantially perpendicular to the second surface 102 of the device substrate 10 or slanted with respect to the second surface 102 of the device substrate 10.

The carrier substrate 20 is then attached to the film 26. In some embodiments, a portion of the film 26 is attached to the fourth surface 204 of the carrier substrate 20 and another portion of film 26 is attached to the second surface 102 of the device substrate 10.

As depicted in FIG. 4B, a dicing operation is performed to cut the device substrate 10 so that the device substrate 10 is divided into pieces, while each piece of the device substrate 10 is still attached to the carrier substrate 20 without falling apart. The device 30 and the respective piece of the device substrate 10 are picked up and separated from the carrier substrate 20. Accordingly, a device structure 70 is fabricated.

In the method of the present disclosure, the device substrate is supported by the carrier substrate, and thus is able to be thinned to a predetermined thickness satisfying the requirement for some devices such as MEMS device and/or semiconductor devices. The thinned device substrate supported by the carrier substrate is compatible with standard semiconductor process and apparatus without increasing the risk of cracking.

In one exemplary aspect, a method for manufacturing a structure is provided. The method includes the following operations. A device substrate having a first surface and a second surface opposite to each other is received. A carrier substrate having a third surface and a fourth surface opposite to each other is received. An intermediate layer is formed between the third surface of the carrier substrate and the second surface of the device substrate. The second surface of the device substrate is attached to the third surface of the carrier substrate. The device substrate is thinned from the first surface. A device is formed over the first surface of the device substrate. The carrier substrate and the device substrate are patterned from the fourth surface to form a cavity in the carrier substrate, the intermediate layer and the device substrate.

In another exemplary aspect, a method for manufacturing a MEMS structure is provided. The method includes the following operations. A substrate having a carrier substrate, a device substrate and an intermediate layer interposed therebetween is provided. The intermediate layer has a plurality of recesses. The device substrate is thinned. A MEMS device is formed over the device substrate, wherein the MEMS device comprises a diaphragm, a plate overlapping the diaphragm, and at least one dielectric layer enclosing the diaphragm and the plate. The substrate is etched to form a cavity exposing the dielectric layer. A portion of the dielectric layer is etched to expose the diaphragm and the plate and a portion of the intermediate layer is etched simultaneously.

In yet another aspect, a MEMS structure is provided. The MEMS device includes a substrate, a plate, a diaphragm, a cavity and a bump. The substrate has a first surface and a second surface. The plate is disposed over the first surface of the substrate. The diaphragm is disposed over the first surface of the substrate. The cavity is formed in the substrate and exposes the plate and the diaphragm. The bump is disposed on the second surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a structure, comprising:
receiving a device substrate having a first surface and a second surface opposite to each other;
receiving a carrier substrate having a third surface and a fourth surface opposite to each other;
forming an intermediate layer between the third surface of the carrier substrate and the second surface of the device substrate;
attaching the second surface of the device substrate to the third surface of the carrier substrate;
thinning the device substrate from the first surface;
forming a device over the first surface of the device substrate;
patterning the carrier substrate and the device substrate from the fourth surface to form a cavity in the carrier substrate, the intermediate layer and the device substrate;
attaching the fourth surface of the carrier substrate to a film;
cutting the device substrate; and
picking up the device and the device substrate from the carrier substrate.

2. The method of claim 1, wherein the intermediate layer is formed over the third surface of the carrier substrate prior to attaching the second surface of the device substrate to the third surface of the carrier substrate.

3. The method of claim 1, further comprising patterning the intermediate layer to form a recess in the intermediate layer prior to attaching the second surface of the device substrate to the third surface of the carrier substrate.

4. The method of claim 1, further comprising patterning the device substrate from the second surface to form a notch in the device substrate.

5. The method of claim 1, further comprising patterning the carrier substrate from the fourth surface to form a notch in the carrier substrate.

6. The method of claim 1, wherein a thickness of the device substrate is thinned down to be ranged substantially from 50 micrometers to 400 micrometers.

7. The method of claim 1, wherein forming the device over the first surface of the device substrate comprises forming a film stack of a plurality of dielectric layers and conductive layers.

8. The method of claim 7, wherein the conductive layers comprises a plate and a diaphragm spaced away from each other by at least one of the dielectric layers.

9. The method of claim 8, further comprising forming a plurality of connection pads and etching stop layers over the film stack, wherein the connection pads are electrically connected to the plate and the diaphragm, respectively, and the etching stop layers cover lateral sides of the connection pads, respectively.

10. The method of claim 7, further comprising etching a portion of each of the dielectric layers through the cavity.

11. The method of claim 10, further comprising etching a portion of the intermediate layer along with etching the portion of each of the dielectric layers.

12. The method of claim 1, wherein the film is substantially leveled with the fourth surface of the carrier substrate.

13. A method for manufacturing a MEMS structure, comprising:
receiving a substrate having a carrier substrate, a device substrate and an intermediate layer interposed therebetween, wherein the intermediate layer has a plurality of recesses;
thinning the device substrate;
forming a MEMS device over the device substrate, wherein the MEMS device comprises a diaphragm, a plate overlapping the diaphragm, and at least one dielectric layer enclosing the diaphragm and the plate;
etching the substrate to form a cavity exposing the dielectric layer;
etching a portion of the dielectric layer to expose the diaphragm and the plate and etching a portion of the intermediate layer simultaneously;
attaching the carrier substrate to a film;
cutting the substrate; and
separating the device substrate and the MEMS device from the carrier substrate.

14. The method of claim 13, wherein a thickness of the device substrate is thinned down to be ranged substantially from 50 micrometers to 400 micrometers.

15. The method of claim 13, wherein a portion of the intermediate layer remains on the device substrate subsequent to separate the device substrate and the MEMS device from the carrier substrate.

16. The method of claim 13, further comprising patterning the device substrate to form a notch in the device substrate.

17. The method of claim 13, further comprising patterning the carrier substrate to form a notch in the carrier substrate.

18. The method of claim 13, further comprising etching the portion of the dielectric layer and the portion of the intermediate layer through the cavity.

19. The method of claim 13, further comprising forming a plurality of connection pads and etching stop layers over the MEMS device, wherein the connection pads are electrically connected to the plate and the diaphragm, respectively, and the etching stop layers cover lateral sides of the connection pads, respectively.

20. The method of claim 13, wherein the diaphragm is suspended after a portion of the dielectric layer is etched.

* * * * *